(12) United States Patent
Yang et al.

(10) Patent No.: US 8,626,809 B2
(45) Date of Patent: Jan. 7, 2014

(54) METHOD AND APPARATUS FOR DIGITAL UP-DOWN CONVERSION USING INFINITE IMPULSE RESPONSE FILTER

(75) Inventors: Jun-Seok Yang, Seoul (KR);
Won-Cheol Lee, Seoul (KR);
Hyung-Min Jang, Seoul (KR)

(73) Assignees: Samsung Electronics Co., Ltd (KR);
Soongsil University (KR)

( * ) Notice: Subject to any disclaimer, the term of this patent is extended or adjusted under 35 U.S.C. 154(b) by 840 days.

(21) Appl. No.: 12/711,959

(22) Filed: Feb. 24, 2010

(65) Prior Publication Data

US 2010/0217790 A1   Aug. 26, 2010

(30) Foreign Application Priority Data

Feb. 24, 2009   (KR) .................. 10-2009-0015446

(51) Int. Cl.
*G06F 17/17*   (2006.01)
*G10L 13/00*   (2006.01)

(52) U.S. Cl.
USPC .......................................... 708/313; 704/265

(58) Field of Classification Search
USPC ........................................................ 708/313
See application file for complete search history.

(56) References Cited

U.S. PATENT DOCUMENTS

| 2003/0076950 A1* | 4/2003 | Usman et al. ............. 379/406.08 |
| 2004/0116083 A1* | 6/2004 | Suzuki et al. ................. 455/126 |
| 2006/0126822 A1* | 6/2006 | Schmidt et al. .......... 379/406.01 |
| 2006/0176989 A1* | 8/2006 | Jensen .......................... 375/350 |

FOREIGN PATENT DOCUMENTS

| KR | 1020020059739 | 7/2002 |
| WO | WO 01/37444 | 5/2001 |

OTHER PUBLICATIONS

Jie Chen and Keshab K. Parhi, New stable IIR modeling of Long Fir filters with Low complexity, Oct. 2008, pp. 1649-1653.*
Wikibooks.org, Control System Poles and Zeros, Feb. 2007, pp. 1-4.*

* cited by examiner

*Primary Examiner* — Henry Tsai
*Assistant Examiner* — Dean Phan
(74) *Attorney, Agent, or Firm* — The Farrell Law Firm, P.C.

(57) ABSTRACT

A method and an apparatus for digital up-down conversion using an Infinite Impulse Response (IIR) filter are provided. The method for digital up-down conversion for frequency conversion in a mobile communication system using plural frequency converts, includes IIR-filtering, by a magnitude response IIR filter having the same magnitude response as in Finite Impulse Response (FIR) filtering, an input signal and a stable filter coefficient calculated according to a Levinson polynomial; and receiving, by the magnitude response IIR filter, the IIR filtered signal, and performing IIR filtering by a phase compensation IIR filter having a filter coefficient compensating for a non-linear phase to a linear phase.

8 Claims, 12 Drawing Sheets

METHOD AND APPARATUS FOR DIGITAL UP-DOWN CONVERSION USING INFINITE IMPULSE RESPONSE FILTER

PRIORITY

This application claims priority under 35 U.S.C. §119(a) to an application filed in the Korean Industrial Property Office on Feb. 24, 2009 and assigned Ser. No. 10-2009-0015446, the entire contents of which are incorporated herein by reference.

BACKGROUND OF THE INVENTION

1. Field of the Invention

The present invention relates generally to a method and an apparatus for digital up-down conversion using an Infinite Impulse Response (IIR) filter, and more particularly, to a method for digital up-down conversion for reducing a delay time greater than a delay time in a structure using a conventional Finite Impulse Response (FIR) filter by applying a decimation filter and an interpolation filter used in up-conversion and down-conversion procedures in a relay system as an IIR filter structure, and an apparatus thereof.

2. Description of the Related Art

A conventional service enterpriser establishes infrastructure, through extension of a base station, in order to provide various high-quality wireless communication services to a user. However, as the number of service subscribers has increased, in order to maintain service quality, most communication service enterprisers have installed and managed a relay capable of increasing communication network coverage for a shade zone, which has relatively lower installation and maintenance costs than installation and maintenance costs of a conventional base station, which typically has a high cost as a main communication infra construction method. Such a relay system functions as a relay between a base station and a user. The relay system amplifies a received signal that has a weak power due to various reasons such as a distance from a base station and a channel environment, eliminates interference from the amplified signal, and transmits the amplified signal back to a user.

Meanwhile, in recent years, mobile communication systems have been using Orthogonal Frequency Division Multiplexing (OFDM) to increase a transmission rate of signals. A system using OFDM as a modulation technology requires a guard interval between symbols in order to prevent deterioration of performance caused by intersymbol interference. The guard interval is determined considering a delay spread. Accordingly, as a transmission delay occurs between a transmitting end and a receiving end, when the delay spread becomes larger than the guard interval of the OFDM, intersymbol interference occurs in demodulation of a receiving procedure.

Accordingly, a delay time occurring between a transmitting end and a receiving end, in particular during a relay procedure causes intersymbol interference, thereby degrading system performance. Therefore, there is a need for a scheme for reducing a delay time of the relay so as to prevent degradation of the system performance.

In particular, an element having a most significant influence on a time delay in a conventional relay system is processing delay times of a decimation filter and an interpolation filter used during up-down conversion procedures. A general FIR filter has a disadvantage, in that the general FIR filter cannot reduce a delay time below a given limit while maintaining a magnitude response characteristic of a filter during a processing procedure of a relay system due to an original delay and a processing delay time.

Consequently, there is a demand for a method of reducing processing delay times of a decimation filter and an interpolation filter with an FIR filter.

SUMMARY OF THE INVENTION

The present invention has been made in view of the above problems, and provides a method for digital up-down conversion that implements a decimation filter and an interpolation filter using an Infinite Impulse Response (IIR) filter, which is approximate to an FIR filter, and has a stable magnitude response characteristic and a processing delay time of a filter itself relatively less than that of a Finite Impulse Response (FIR) filter, and an apparatus thereof.

In accordance with an aspect of the present invention, a method for performing digital up-down conversion for a frequency conversion in a mobile communication system using plural frequency conversion includes IIR-filtering, by a magnitude response IIR filter having the same magnitude response as in FIR filtering, an input signal and a stable filter coefficient calculated according to a Levinson polynomial; and receiving, by the magnitude response IIR filter, the IIR filtered signal, and performing IIR filtering by a phase compensation IIR filter having a filter coefficient compensating for a non-linear phase to a linear phase.

In accordance with another aspect of the present invention, an apparatus for performing digital up-down conversion for a frequency conversion in a mobile communication system using plural frequency converts includes a magnitude response unit for IIR-filtering an input signal by a magnitude response IIR filter having the same magnitude response as in FIR filtering and a stable filter coefficient calculated by a Levinson polynomial; and a phase compensation unit for receiving the IIR filtered signal by the magnitude response IIR filter, and for performing IIR filtering by a phase compensation IIR filter having a filter coefficient compensating for a non-linear phase to a linear phase.

Unlike a conventional FIR filter having no secure stability and having a non-linear phase response characteristic, since an IIR filter of the present invention has secure stability and a linear phase response characteristic, it may reduce a delay time in a digital up-down conversion procedure of a relay.

BRIEF DESCRIPTION OF THE DRAWINGS

The objects, features and advantages of the present invention will be more apparent from the following detailed description in conjunction with the accompanying drawings, in which.

DETAILED DESCRIPTION OF EMBODIMENTS

Embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

Figure 1:
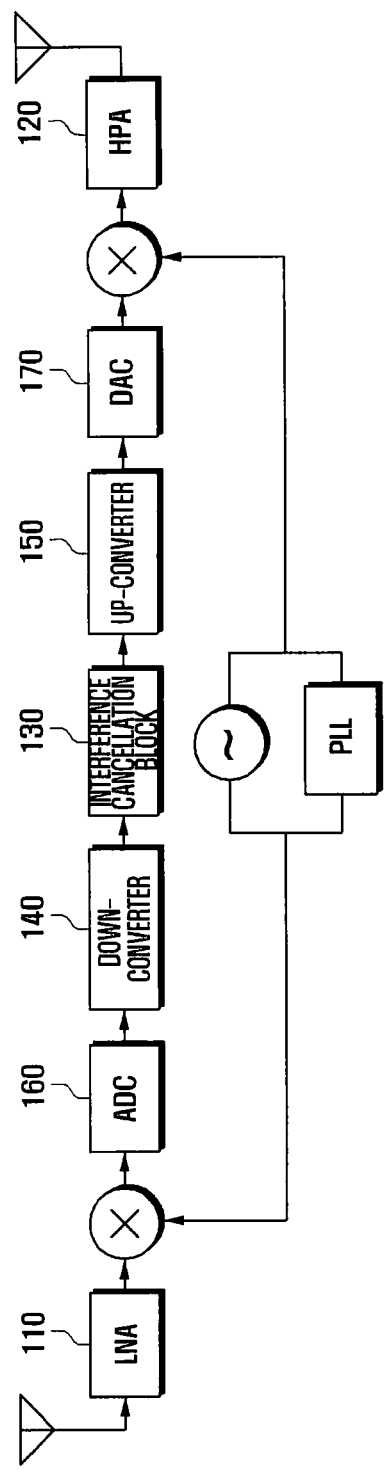
FIG. 1 is a block diagram illustrating an inner structure of a conventional relay.

FIG. 1 is a block diagram illustrating an inner structure of a conventional relay.

Referring to FIG. 1, the conventional relay includes an RF front-end unit having a low noise amplifier 110 and a high output amplifier 120, an interference cancellation block 130 functioning as an interference cancellation system, a digital down-converter 140 down-converting a signal from a high frequency band to a baseband for interference cancellation, a digital up-converter 150 up-converting a signal from which interference is cancelled into the high frequency band, an analog/digital converter 160 converting an analog signal into a digital signal, and a digital/analog converter 170 converting a digital signal into the analog signal.

Figure 2:
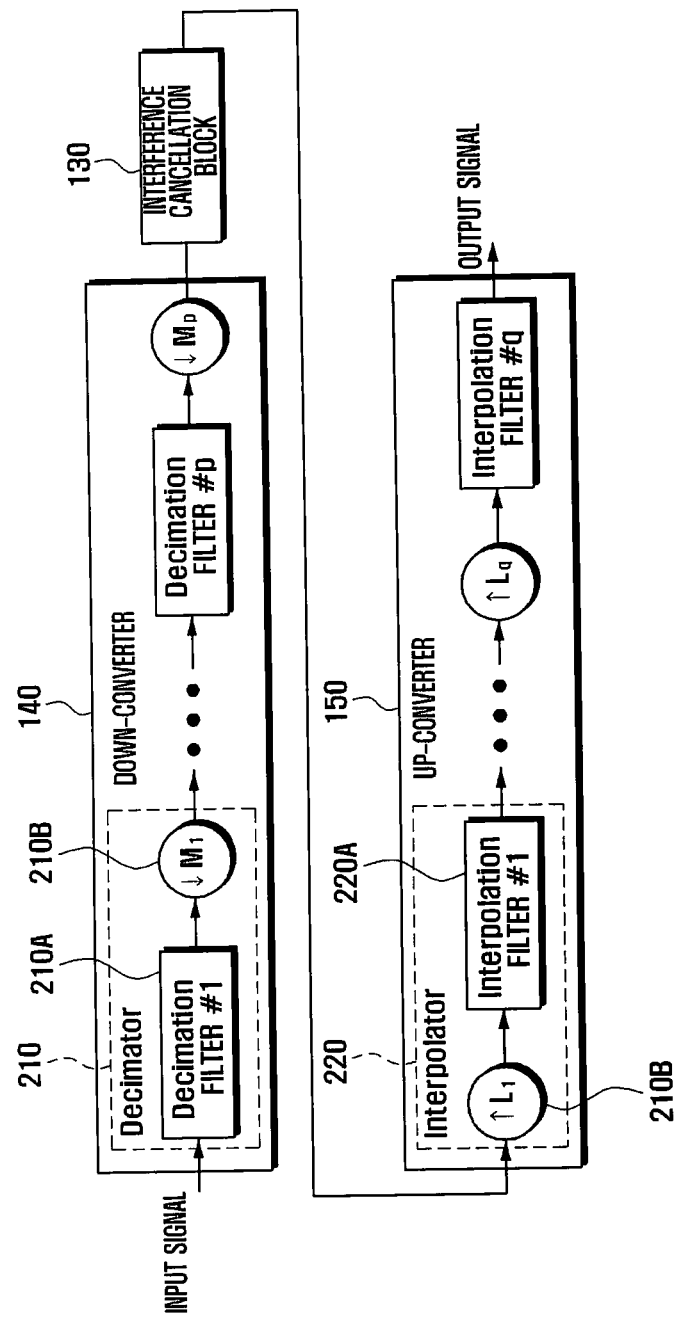
FIG. 2 is a block diagram illustrating inner structures of a down-converter and an up-converter of a conventional relay.

FIG. 2 is a block diagram illustrating inner structures of the down-converter 140 and the up-converter 150 of the conventional relay.

Referring to FIG. 2, the down-converter 140 includes a plurality of decimators 210. Each of decimators 210 includes a decimation filter 210A for removing a noise included in an input signal and a down sampler 210B for down-converting a frequency of the signal from the decimation filter 210A. Similarly, the up-converter 150 includes a plurality of interpolators 220. Each of the interpolators 220 includes an interpolation filter 220A for removing a noise included in an output signal of the interference cancellation block 130 and an up-sampler 220B for up-converting a frequency of the signal output from the interpolation filter 220A.

The down-converter 140 and the up-converter 150 shown in FIG. 2 may perform decimation and interpolation procedures through various combinations of a plurality of divided units to minimize a complexity of each of the filters. In order to eliminate images and aliasing that occurs during the decimation and interpolation procedures, the down-converter 140 and the up-converter 150 perform a filtering operation. In this case, a filter used for a conventional relay system uses an FIR filter having a general stable output.

Figure 3:
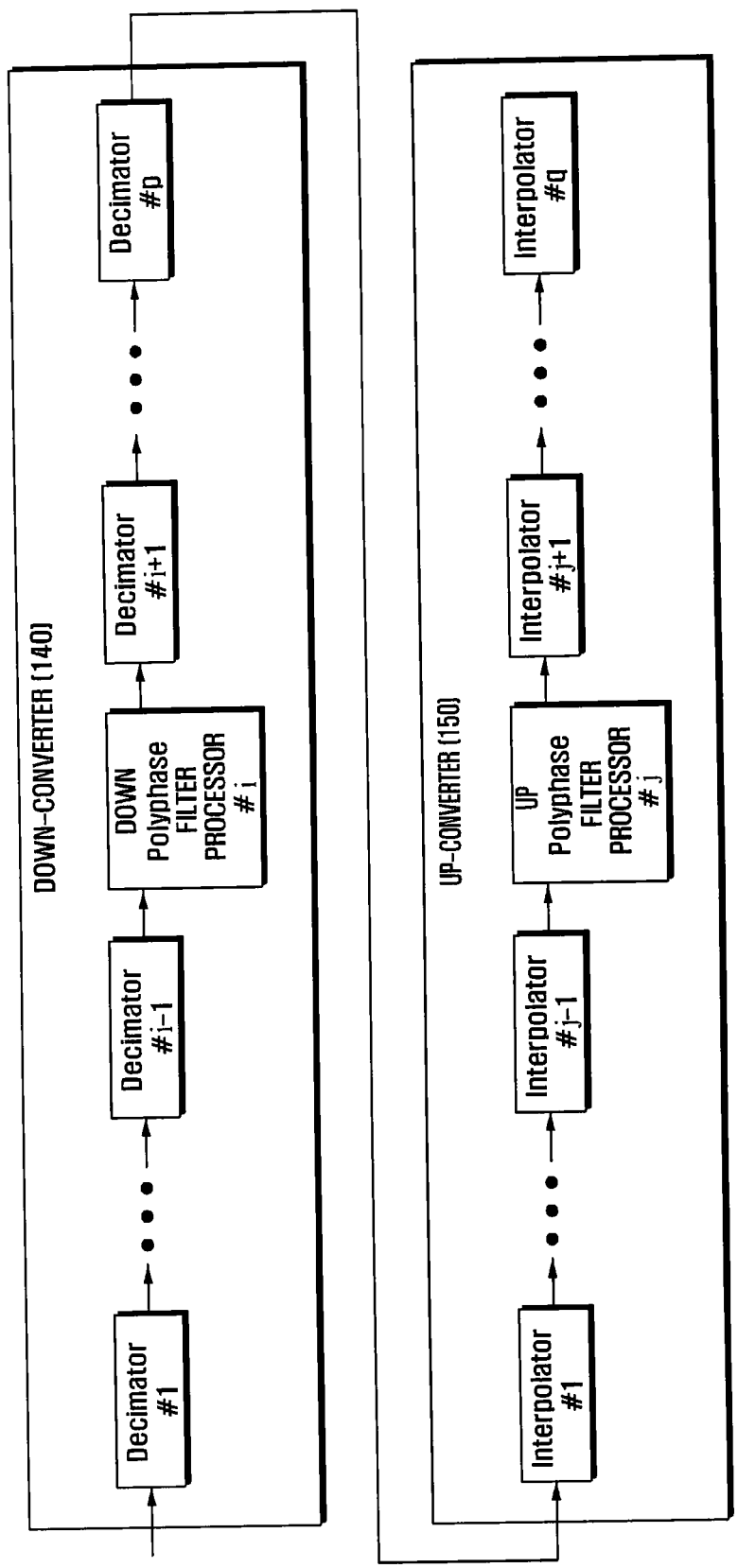
FIG. 3 is a block diagram illustrating decimation and interpolation procedures applied to a poly-phase structure.

FIG. 3 is a block diagram illustrating decimation and interpolation procedures applied to a poly-phase structure.

One of the decimation filter 210A and the interpolation filter 220A shown in FIG. 2 can be changed to the poly-phase structure to be used as shown in FIG. 3. Because the poly-phase structure may process filtering through plural computations in a lower transmission rate for the same time, the poly-phase structure can implement a system with lower complexity.

Figure 4:
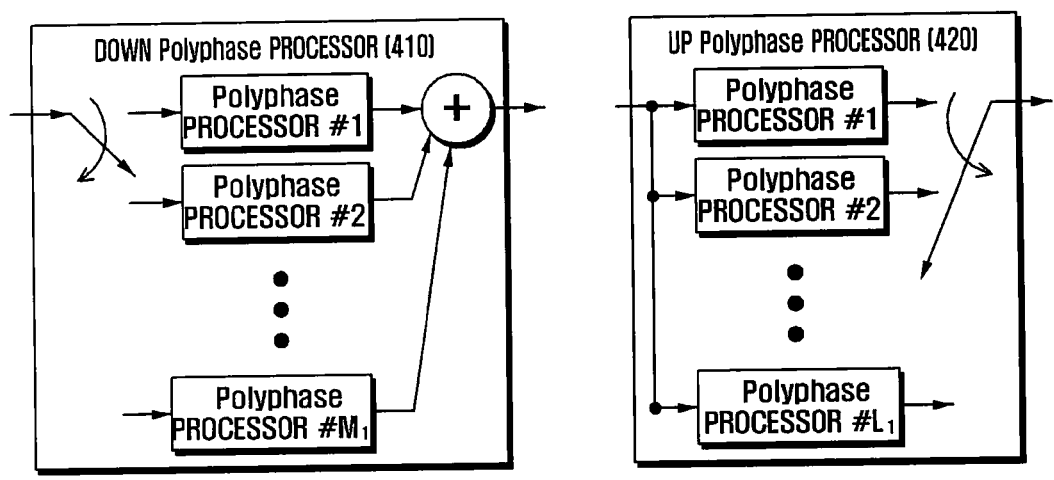
FIG. 4 is a detail view illustrating a poly-phase filter with a poly-phase structure.

FIG. 4 is a detailed view illustrating a poly-phase filter with a poly-phase structure.

FIG. 4 includes a down poly-phase processor 410 which decreases a sampling rate of data while preventing aliasing and an up poly-phase processor 420 which increases a sampling rate of data while eliminating image components which are generated when increasing the sampling rate of data. The down poly-phase processor 410 plays a role of one decimator 210 in FIG. 2 while having a poly-phase structure that uses an adder when implementing it. In addition, the up poly-phase processor 420 plays a role of one interpolator 220 in FIG. 2 while having a poly-phase structure that uses an adder when implementing it.

Meanwhile, a delay time occurring during a relaying procedure of a relay causes intersymbol interference to degrade the performance of the system. There is a need to reduce the delay time of the relay so as to prevent degradation of system performance. However, a decimation filter and an interpolation filter used for down-conversion or up-conversion procedure of the relay are implemented using an FIR filter. In this case, the FIR filter requires relatively many coefficient values for high quality filter characteristics. This usage of many coefficient values causes an excessive processing delay time.

Accordingly, the present invention implements a decimation filter and an interpolation filter (hereinafter, referred to as 'frequency conversion filter' meaning a filter used in frequency up-down conversions) using an IIR filter having magnitude response characteristics similar to response characteristics of the conventional FIR filter and a relatively shorter processing delay time than that the processing delay time of the conventional FIR filter.

In a typical IIR filter, since an input signal and an output signal are fed back to perform filtering, and accordingly divergence can occur due to a feedback loop, the stability is not secure. Unlike an FIR filter, which has linear phase response characteristics, the IIR filter has non-linear phase response characteristics. Since a wave of an input signal and a wave of an output signal differ from each other in the IIR filter with the non-linear phase response characteristics, the IIR filter has degraded signal quality.

Accordingly, the present invention includes an IIR filter with a stable gain, and implements a frequency conversion filter with a relatively shorter delay time than a delay time of a conventional FIR filter while solving the foregoing problems of the IIR filter by linearizing non-linear phase response characteristics.

Figure 5:
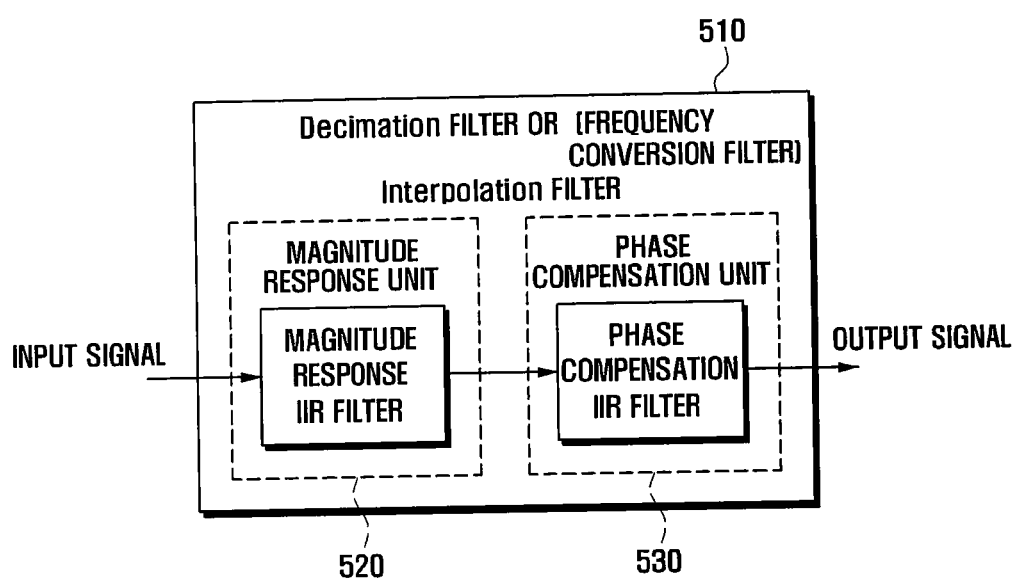
FIG. 5 is block diagram illustrating an inner structure of a frequency conversion filter using an IIR filter according to an embodiment of the present invention.

FIG. 5 is block diagram illustrating an inner structure of a frequency conversion filter 510 using an IIR filter according to an embodiment of the present invention. The frequency conversion filter 510 includes a magnitude response unit 520 serially connected to a phase compensation unit 530.

The magnitude response unit 520 is implemented by a magnitude response IIR filter. A coefficient of the magnitude response IIR filter is determined using magnitude response characteristics of the conventional FIR filter. In this case, the magnitude response IIR filter of the magnitude response unit 520 is implemented by magnitude response characteristics similar to an original spectrum of an FIR filter and IIR filter coefficients with secure stability. The magnitude response unit 520 creates an entire transfer function of the IIR filter, namely, an equation regarding H(z) using given frequency characteristics of a conventional FIR filter, and approximates the equation in a form of the IIR filter. In this case, a transfer function approximated in the form of the IIR filter is defined as H(z). The H(z) can be expressed by Equation (1), as follows.

$$H(z) = \frac{b_0 + b_1 z^{-1} + \ldots + b_M z^{-M}}{1 + a_1 z^{-1} + \ldots + a_N z^{-N}} \quad \text{Equation (1)}$$

In Equation (1), orders of a numerator polynomial and a denominator polynomial are M and N, respectively. The magnitude response unit 520 of the present invention sets a denominator order M of the transfer function in the magnitude response IIR filter to be always greater than or equal to a numerator order N thereof. a and b are constants. z is a variable for the transfer function H(z).

The magnitude response unit 520 requires reference frequency characteristics to determine a response of the magnitude response IIR filter. Accordingly, the magnitude response unit 520 receives required frequency characteristics of a filter, and calculates an impulse response sequence of the IIR filter using the received required frequency characteristics. Then, the magnitude response unit 520 determines a maximum order of the IIR filter to be designed, calculates autocorrelation values of an impulse response sequence corresponding thereto, and sequentially increases orders of a numerator polynomial and a denominator polynomial in the IIR filter using the calculated autocorrelation values to calculate a Levinson polynomial.

According to an embodiment of the present invention, the magnitude response unit 520 calculates coefficients of the transfer function expressed by Equation (1) using coefficients of the Levinson polynomial. In order to calculate the Levinson polynomial, a magnitude response of a filter to be modeled is previously required. To acquire the magnitude response, the magnitude response unit 520 receives and applies Inverse Fourier transform to frequency response characteristics for a prototype channel filter (namely, a conventional FIR filter) to calculate an autocorrelation sequence. In this case, to obtain a transfer function of the magnitude response IIR filter expressed by Equation (1), there the coefficients of the Levinson polynomial must have an order of M+N. The Levinson polynomial is used to solve a regulation equation upon designing an optimal filter, which is widely used in spectrum estimation or predictive filter arrangement. Levinson polynomials are known to those having ordinary skill in the art, and thus the detailed description thereof is omitted herein. Detailed information of the Levinson polynomial and stability checking is described in Monson H. H., "Statistical Digital Signal Processing and Modeling," John Wiley & Sons, INC., 1996.

The magnitude response unit 520 also checks the security of magnitude stability according to the calculated Levinson polynomial to determine a magnitude response of the magnitude response IIR filter.

The phase compensation unit 530 is configured by a phase compensation IIR filter based on a full-band pass, and compensates for a non-linear phase of a signal output from the magnitude response unit 520. The phase compensation unit 530 linearizes phase response characteristics to solve a problem where a magnitude response of a magnitude response IIR filter output from the magnitude response unit 520 is non-linear. Meanwhile, the phase compensation unit 530 according to an embodiment of the present invention can have complex coefficients.

Phase compensation IIR filter coefficients of the phase compensation unit 530, which are used for performing the foregoing function, are acquired through an adaptive filtering procedure of an adaptive filtering unit. The adaptive filtering unit receives a reference signal to be produced through adaptive filtering and the same signal as that having a non-linear phase output from the magnitude response unit 520. Further, the adaptive filtering unit performs the adaptive filtering procedure by adjusting convergence speed and a convergence degree thereof. Consequently, the adaptive filtering unit may output a phase compensation IIR filter coefficient for compensating a non-linear phase of a signal.

The phase compensation unit 530 compensates a non-linear phase output from the magnitude response unit 520 using the phase compensation IIR filter coefficient output from the adaptive filtering unit. The adaptive filtering procedure is described in detail with reference to FIG. 9.

Figure 6:
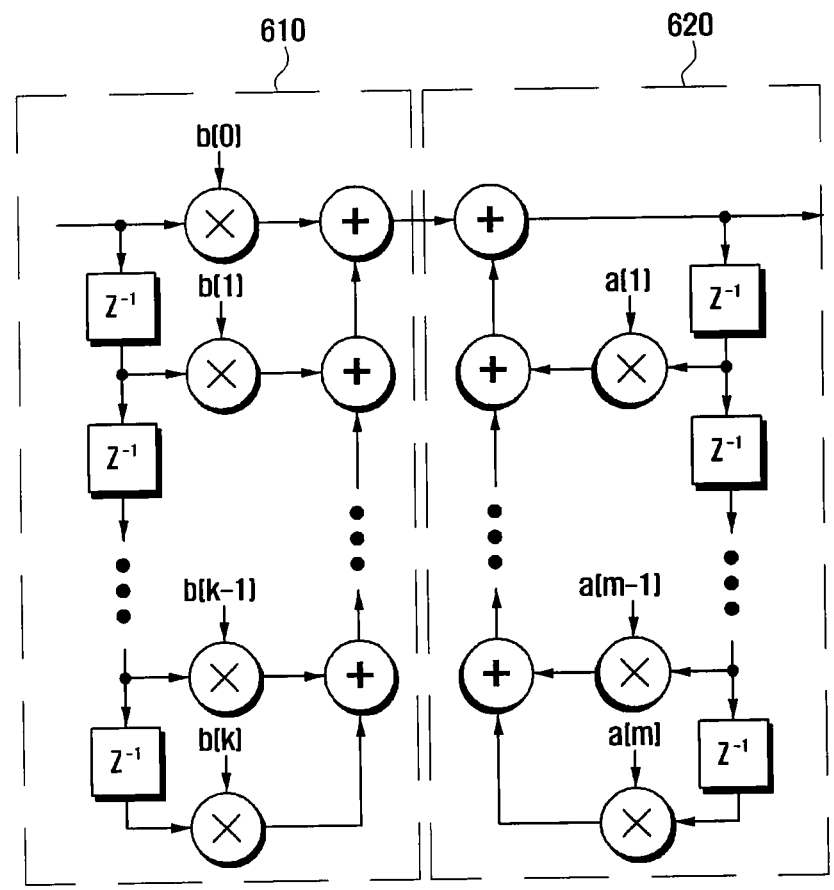
FIG. 6 is a detailed view illustrating a magnitude response IIR filter of a magnitude response unit according to an embodiment of the present invention.

FIG. 6 is a view illustrating a magnitude response IIR filter of a magnitude response unit 520 according to an embodiment of the present invention.

FIG. 6 has a direct form I structure for implementing the magnitude response IIR filter. A first part 610 is a part for obtaining a coefficient of numerator polynomial k+1, and a second part 620 is a part for obtaining a coefficient of denominator polynomial m.

The magnitude response IIR filter differs from an FIR filter that the magnitude response unit 520 has a feedback loop. The IIR filter of a magnitude response unit 520 has a group delay time and a filter coefficient less than those of the FIR filter.

Figure 7:
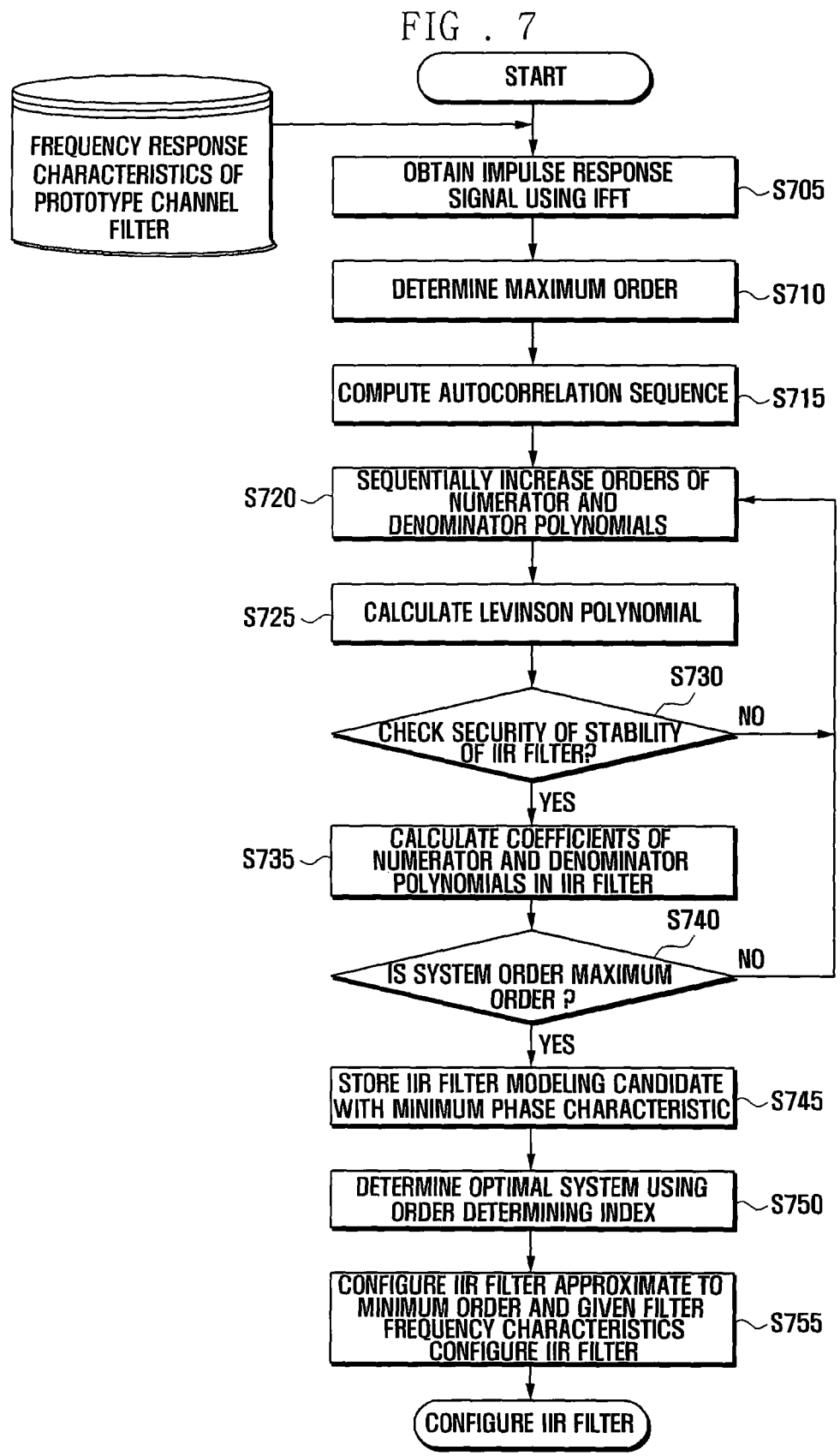
FIG. 7 is a flow chart illustrating a method for configuring a magnitude response IIR filter by a magnitude response unit using prototype filter magnitude response characteristics according to an embodiment of the present invention.

FIG. 7 is a flow chart illustrating a method for configuring a magnitude response IIR filter by a magnitude response unit 520 using prototype filter magnitude response characteristics according to an embodiment of the present invention. According to an embodiment of the present invention, configuration of a magnitude response IIR filter by the magnitude response unit 520 refers to obtaining coefficients ('a', 'b', etc.) of the magnitude response IIR filter shown in FIG. 6.

The magnitude response unit 520 according to an embodiment of the present invention creates a magnitude response IIR filter securing stability while maintaining magnitude response characteristics similar to magnitude response characteristics of the conventional FIR filter through a method according the flow chart shown in FIG. 7.

The magnitude response unit 520 receives magnitude response characteristics of a conventional FIR prototype filter in order to obtain required frequency characteristics of a filter, and obtains an impulse response signal using Inverse Fast Fourier Transform (IFFT), in step S705. The magnitude response unit 520 determines a maximum order of a magnitude response IIR filter to be designed, in step S710, and calculates an autocorrelation sequence of an impulse response signal corresponding to the determined maximum order, in step S715.

The autocorrelation sequence is a set of parameters for determining magnitude response characteristics. Autocorrelation sequence values corresponding to a magnitude response of a magnitude response IIR filter designed from a Levinson polynomial calculated using the autocorrelation sequence automatically correspond to automatically and previously provided autocorrelation sequence values.

The magnitude response unit 520 sequentially increases orders of numerator and denominator polynomials in a magnitude response IIR filter using autocorrelation values calculated in following procedures, in step S720, to calculate a Levinson polynomial, in step S725. When the stability of the magnitude response IIR filter according to the calculated Levinson polynomial is secure, in step S730, the magnitude response unit 520 calculates coefficients of numerator and denominator polynomials in a magnitude response IIR filter through Equation (1), in step S735.

In this case, the magnitude response unit 520 calculates parameters of a bounded-real function $\rho_{p+q}(z)$ using a linear equation to check the stability of the magnitude response IIR filter. The calculated $\rho_{p+q}(z)$ is a rational number, which is expressed as a ratio of a denominator polynomial and a numerator polynomial.

Here, p and q, respectively, are orders of a denominator polynomial and a numerator polynomial of the IIR filter for testing stability.

In this case, to determine the stability, a determination of whether all roots of the numerator polynomial exist in a unit circle is performed. When all of the roots of the numerator polynomial in the bounded-real function exist in the unit circle, the magnitude response IIR filter is stable. Further, if a magnitude of a frequency response of the obtained $\rho_{p+q}(z)$ is smaller than 1, then $\rho_{p+q}(z)$ satisfies a bounded-real characteristic condition. A magnitude response IIR filter calculated by the bounded real-function $\rho_{p+q}(z)$ satisfying the bounded-real characteristic condition and the coefficients of a Levinson polynomial is automatically stable.

On the other hand, when the stability of an IIR filter according to the calculated Levinson polynomial is not secure, the routine returns to step S720 and the magnitude response unit 520 increases an order and calculates a Levinson polynomial of a next order to calculate a magnitude response IIR filter having the secure stability. The foregoing procedures are repeated until an order of a magnitude response IIR filter becomes a maximum order determined at step S710.

The magnitude response unit 520 compares a plurality of magnitude response characteristics finally obtained through the foregoing procedures with a magnitude response characteristic of the FIR prototype filter used at step S705, and selects a magnitude response IIR filter with the smallest error.

Figure 8:
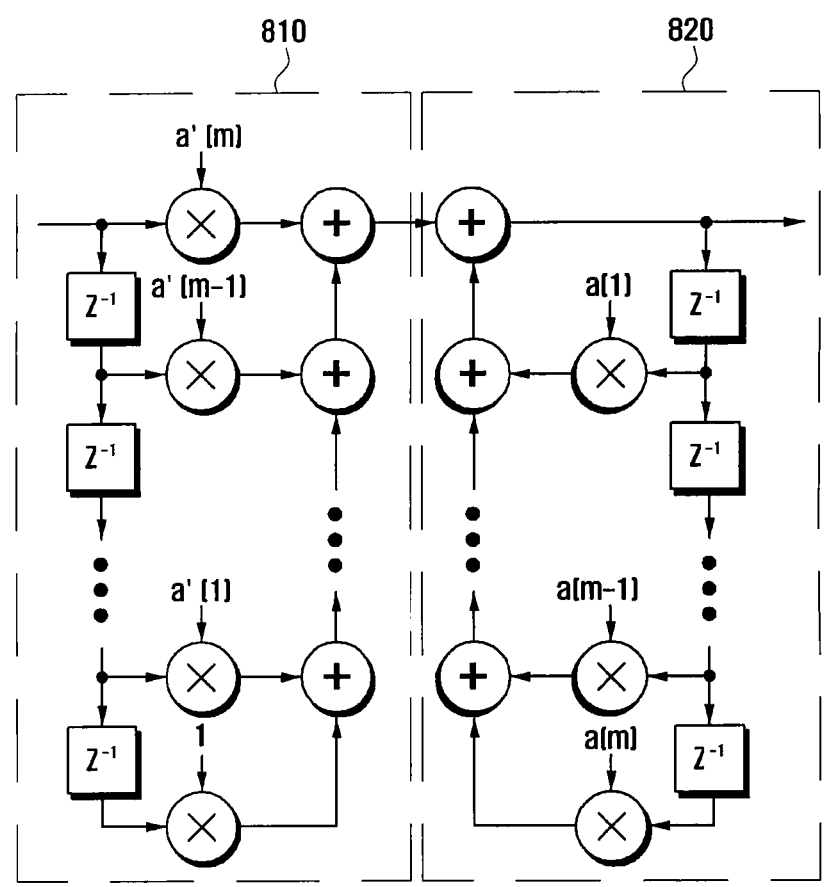
FIG. 8 is view illustrating a structure of a phase compensation IIR filter of a phase compensation unit according to an embodiment of the present invention.

FIG. 8 is view illustrating a structure of a phase compensation IIR filter of a phase compensation unit 530 according to an embodiment of the present invention.

Although similar to FIG. 6, FIG. 8 has a direct form I structure of a IIR filter for compensating a phase while not affecting magnitude response. A third part 810 is a part for obtaining a coefficient of numerator polynomial m+1, and a second part 820 is a part for obtaining a coefficient of denominator polynomial m. In order not to affect magnitude response, the coefficient of the numerator polynomial and the coefficient of the denominator polynomial are arranged in reverse order in such a manner that the coefficient of the numerator polynomial has a form of complex number of the coefficient of the denominator polynomial.

The phase compensation unit 530 of the present invention solves a problem that a phase response characteristic of a signal output from a magnitude response IIR filter of the magnitude response unit 520 is non-linear. Namely, the phase compensation unit 530 linearizes the non-linear phase response characteristic to compensate a degradation of a signal due to the magnitude response IIR filter. The phase compensation unit 530 acquires an optimal filter coefficient through an adaptive filtering procedure. An adaptive filtering procedure according to an embodiment of the present invention is illustrated with reference to FIG. 9 and FIG. 10. A phase compensation IIR filter of the phase compensation unit 530 is implemented by phase compensation IIR filter coefficients output through the adaptive filtering procedure of an adaptive filtering unit 900.

Figure 9:
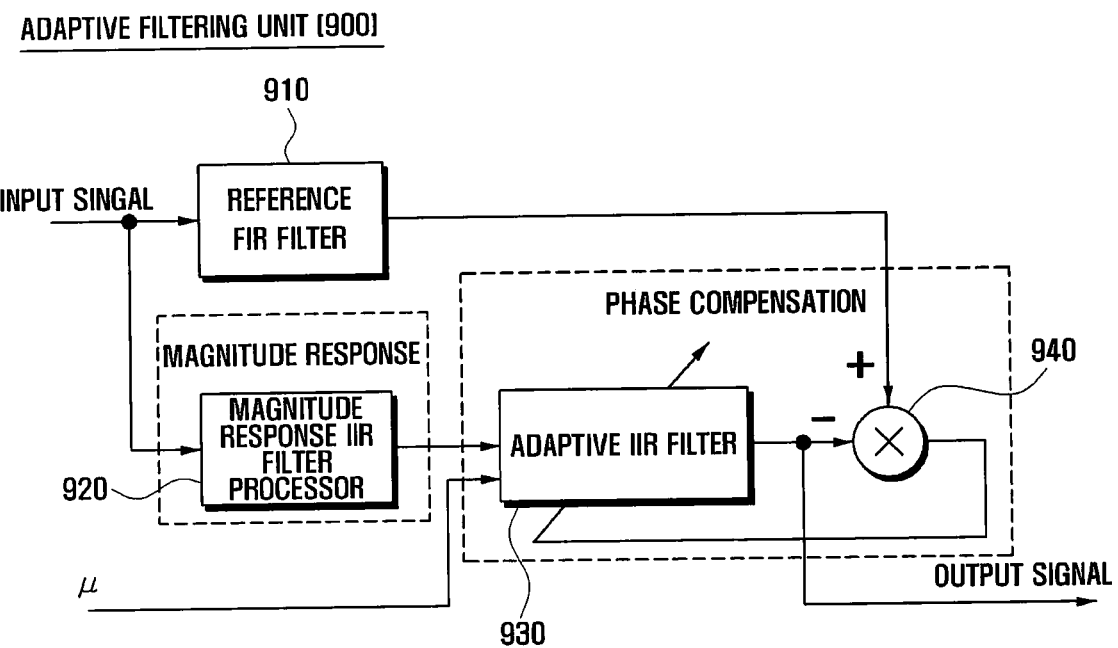
FIG. 9 is a block diagram illustrating an inner structure of an adaptive filtering unit for performing an adaptive filtering procedure according to an embodiment of the present invention.

FIG. 9 is a block diagram illustrating an inner structure of an adaptive filtering unit 900 for performing an adaptive filtering procedure according to an embodiment of the present invention. The adaptive filtering unit 900 according to an embodiment of the present invention includes a reference FIR filter 910, a magnitude response IIR filter processor 920, and an adaptive IIR filter 930.

The reference FIR filter 910 receives an input signal, and produces a reference signal to be produced by the adaptive IIR filter 930.

The magnitude response IIR filter processor 920 receives an input signal identical with a signal input to the reference FIR filter 910 to generate an input signal to the adaptive IIR filter 930. In this case, the magnitude response IIR filter processor 920 may be configured by an IIR filter having the same filter coefficient as a magnitude response IIR filter coefficient determined by the magnitude response unit 520 according to an embodiment of the present invention. Accordingly, an output signal of the magnitude response IIR filter processor 920 is stable but has a non-linear phase.

The adaptive IIR filter 930 receives a signal output from the magnitude response IIR filter 920 and a µ value (or convergence constant) for adjusting convergence speed and a convergence degree of an adaptive filter. The adaptive IIR filter 930 adjusts the µ value and linearizes a non-linear phase of a signal output from the magnitude response IIR filter 920. In the linearization procedure, a magnitude response is equally maintained.

An adder 940 receives signals output from the reference FIR filter 910 and the adaptive IIR filter 930, and calculates a feedback input of an adaptive filter.

As shown in FIG. 9, the adaptive filtering unit 900 changes the µ value and finally converges the adaptive filtering procedure using all the inputs to acquire a phase compensation IIR filter coefficient having a phase characteristic approximating a phase characteristic of a prototype reference signal. In this case, the adaptive filtering unit 900 determines an order of a phase compensation IIR filter using an optimal coefficient computed through the adaptive filtering procedure in consideration of a system delay time limit value and an allowable signal quality degradation degree.

Figure 10:
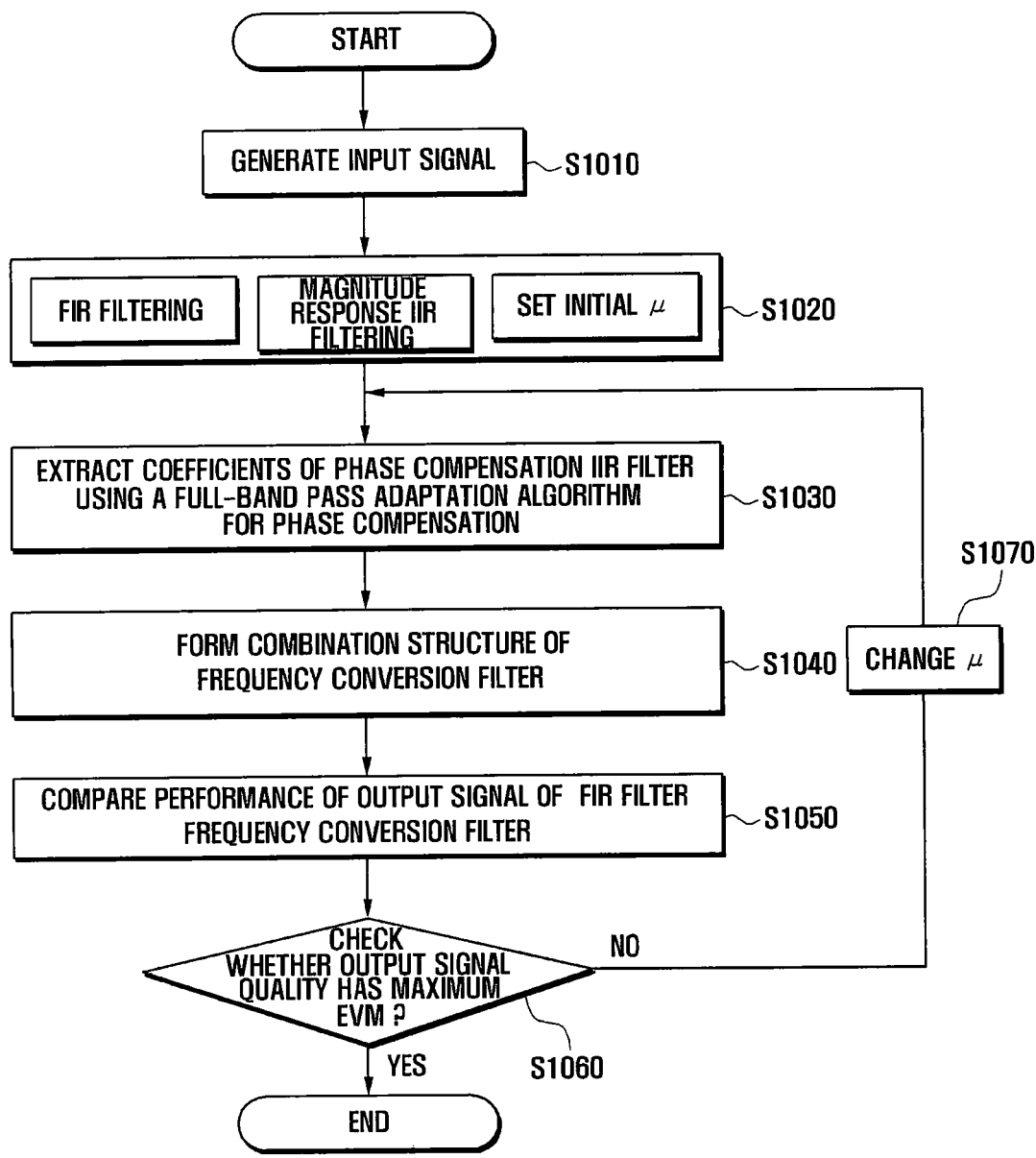
FIG. 10 is a flow chart illustrating an adaptive filtering method by an adaptive filter unit according to an embodiment of the present invention.

FIG. 10 is a flow chart illustrating an adaptive filtering method of an adaptive filter unit 900 according to an embodiment of the present invention.

When a magnitude response IIR filter coefficient of the magnitude response unit 520 is generated, a phase compensation IIR filter of the phase compensation unit 530 should be designed. Namely, there is a need for an operation linearizing a non-linear characteristic output from the magnitude response unit 520. The coefficient of the phase compensation IIR filter is generated by an adaptive filtering procedure of the adaptive filtering unit 900 and is described with reference to FIG. 10.

First, an adaptive filtering unit 900 generates an input signal to be input to a reference FIR filter 910 and a magnitude response IIR filter processor 920, in step S1010. The reference FIR filter 910 and the magnitude response IIR filter processor 920 receive and filter the input signal, in step S1020. Simultaneously, the adaptive filtering unit 900 sets an initial µ value.

Then, the adaptive filtering unit 900 extracts coefficients of a phase compensation IIR filter using a full-band pass adaptation algorithm for phase compensation, in step S1030. In this case, the full-band pass adaptation algorithm for phase compensation may be expressed by Equation (2), as follows:

$$y(n) = x(n-N) + \sum_{k=0}^{N-1} a_k(n)x(n-N+k+1) - \sum_{k=0}^{N-1} a_k(n)y(n-N+k+1)$$

$$e(n) = d(n) - y(n)$$

$$\alpha_0(n) = 2x(n) - \sum_{k=0}^{N-1} a_k(n)\alpha_0(n-k-1)$$

$$\beta_0(n) = -2y^*(n-1) - \sum_{k=0}^{N-1} a_k(n)\beta_0(n-k-1)$$

$$\alpha(n) = [\alpha_0(n-N+1), \alpha_0(n-N+2), \ldots, \alpha_0(n)]^T$$

$$\beta(n) = [\beta_0(n), \beta_0(n-1), \ldots, \beta_0(n-N+1)]^T$$

$$\gamma(n) = jy(n)$$

$$\nabla_n = -e^*(n)\begin{bmatrix}\alpha(n)\\\gamma(n)\end{bmatrix} - e(n)\begin{bmatrix}\beta(n)\\\gamma^*(n)\end{bmatrix}$$

$$W(n+1) = W(n) - \mu\Box n$$

($\alpha_0(0)$, $\beta_0(0)$ are an initial value when n is 0, and are not necessarily separately defined)

In Equation (2), $\alpha(n)$ is a row vector composed of N (N is a positive integer) elements, and each element of the row vector is a value obtained by subtracting a changed amount of a filter output due to each IIR filter coefficient from an input signal of the adaptive IIR filter 930, n is a variable for indicating a time change characteristic of coefficients. Similarly, $\beta(n)$ is a vector composed of N elements. Each element of the vector is a value obtained by subtracting a changed amount of a filter output due to each IIR filter coefficient from a negative value of an output signal of the adaptive filtering unit 930. $\gamma(n)$ is a value obtained by multiplying an output signal by a complex coefficient j. Further, e(n) is a value indicating a difference between an ideal output signal and an output signal of the adaptive IIR filter 930, and a filter coefficient of the adaptive IIR filter 930 is W(n). $\Box$n is a slope of a cost function curve for making an error square between a signal passing through a full-band filter with a given linear phase characteristic and a signal passing through an adaptive filter to be minimized. When $\Box$n is converged in a reduction direction and becomes 0, an IIR filter coefficient with an optimal full-band characteristic is obtained. The $\mu$ in Equation (2) represents a constant indicating convergence speed.

Moreover, x(n) is a given or expected input signal, and y(n) is an output signal of the adaptive filtering unit 900, and an ideal output signal is d(n).

The adaptive filtering unit 900 forms a combination structure of a frequency conversion filter using a coefficient of the phase compensation IIR filter extracted by the full-band pass adaptation algorithm, in step S1040. The adaptive filtering unit 900 compares performance of an output signal of an FIR filter with that of the frequency conversion filter 510, in step S1050, and checks output signal quality of the frequency conversion filter 510. Then, the adaptive filtering unit 900 checks whether the output signal quality of the frequency conversion filter 510 has a maximum Error Vector Magnitude (EVM), in step S1060.

When the output signal quality of the frequency conversion filter 510 does not have the EVM, the adaptive filtering unit 900 changes the $\mu$ value, in step S1070, and then repeats step S1030 to step S1060.

When the output signal quality of the frequency conversion filter 510 has the EVM, the adaptive filtering unit 900 applies the used phase compensation IIR filter coefficient to the frequency conversion filter 510 to complete the frequency conversion filter 510.

According to another embodiment of the present invention, a part of a decimation filter or an interpolation filter can be used as a poly-phase structure. A part of each branch filter in the poly-phase structure can be substituted by a frequency conversion filter of the present invention. A concrete example of the poly-phase structure according to an embodiment of the present invention is shown in FIG. 11.

Figure 11:
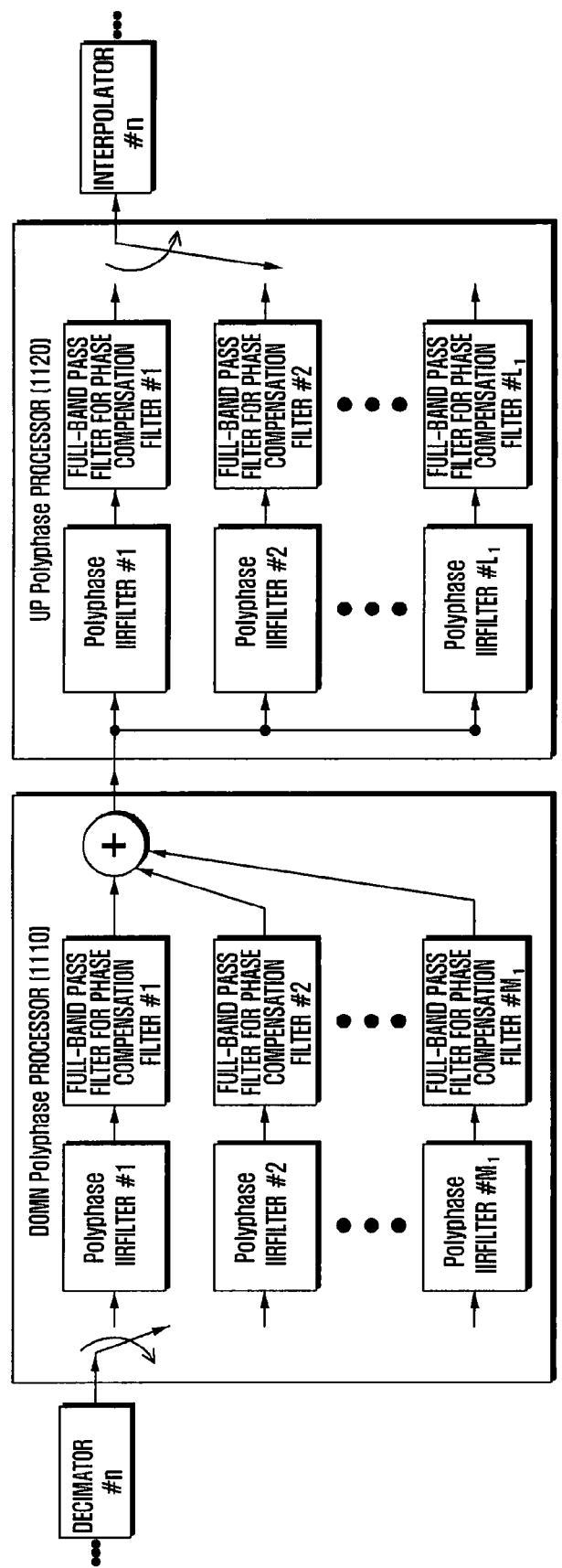
FIG. 11 is a view illustrating a structure in which a partial branch filter of a decimator and an interpolator with a poly-phase structure is substituted by a frequency conversion filter of the present invention according to an embodiment of the present invention.

FIG. 11 is a view illustrating a structure in which a partial branch filter of a decimator and an interpolator with a poly-phase structure is substituted by a frequency conversion filter 510 of the present invention according to an embodiment of the present invention.

FIG. 11 is a view illustrating an example that a IIR filter structure having small delay time of the present invention is applied to a partial decimation filter and interpolation filter in a relay system. In FIG. 11, the down poly-phase processor 1110 changes one decimator 210 which is shown in FIG. 2 into a poly-phase form of FIG. 4, and then, applies the structure of frequency conversion filter 510 to which the IIR filter of FIG. 5 is applied. In addition, the up poly-phase processor 1120 changes one interpolator 220 which is also shown in FIG. 2 into a poly-phase form of FIG. 4, and then, applies the structure of frequency conversion filter 510 to which the IIR filter of FIG. 5 is applied.

In an embodiment of the present invention, in order to minimize a delay time of a relay, a decimator or an interpolator can be configured by a poly-phase structure. In this case, a partial branch filter of the poly-phase structure may be substituted by a frequency convention filter 510, which is a combination of the magnitude response unit 520 and the phase compensation unit 530, to minimize the delay time of the relay.

A method of designing a decimator or an interpolator of a poly-phase structure configured by the frequency conversion filter 510 is described as follows. When a branch filter of an FIR form is directly converted into an IIR filter, it is difficult to design a rapid variation in a transition section of a magnitude response by an IIR filter. Accordingly, a general FIR filter is converted to a magnitude response IIR filter of the present invention before configuration according to a poly-phase structure. Secondly, a generated impulse response of the IIR filter is obtained. Thirdly, each branch filter of a poly-phase structure is extracted from the obtained impulse response. Fourthly, each branch filter extracted from the impulse response is again converted into the magnitude response IIR filter. Fifthly, in order to obtain a performance similar to a performance of the branch filter of a reference FIR form, a phase compensation IIR filter is added to a next unit of the magnitude response IIR filter generated in each branch filter to compensate for a non-linear phase response. Sixthly, the fifth operation is applied to remaining branch filters to complete a poly-phase structure.

When the poly-phase structure that has a branch filter of an IIR structure generated in the foregoing method also has the same delay time, the poly-phase structure may have better signal quality than a case where a general FIR filter is converted into an IIR filter form. That is, when the poly-phase structure that has a branch filter of an IIR structure generated in the foregoing method also has the same signal quality, the poly-phase structure also has a shorter time delay.

Figure 12:
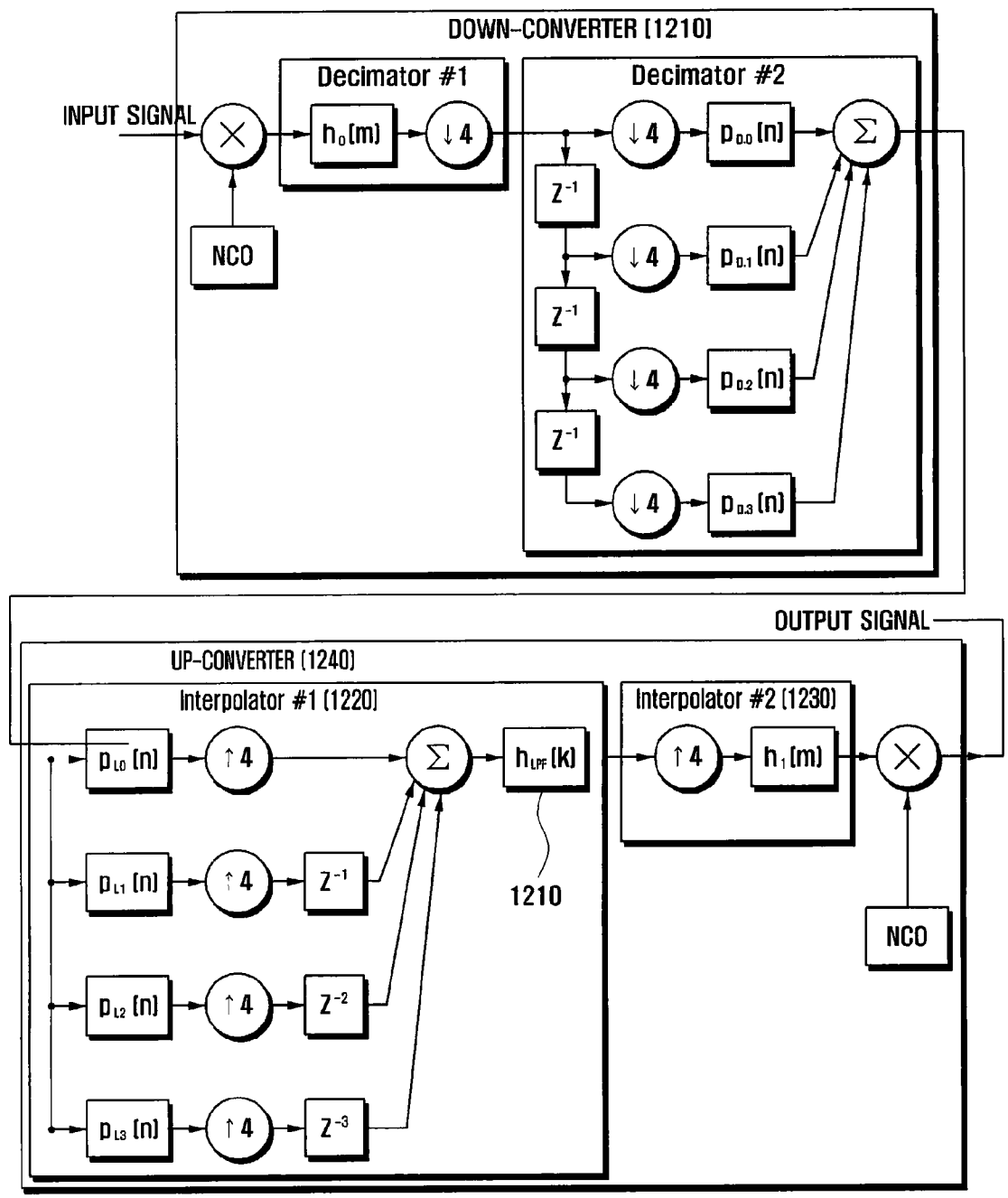
FIG. 12 is a view illustrating a structure of a poly-phase filter including a low pass filter.

In the meantime, when each branch filter of a poly-phase structure is converted into an IIR structure, a phase response of each branch filter is not completely restored, and total poly-phase filter magnitude response may have a spectrum peak in a rejection band of a total poly-phase filter magnitude response. As described above, so as to eliminate a spectrum peak occurring in a rejection band of an up-conversion part, a low pass filter $h_{LPF}(k)$ is designed to be added to the up-conversion part. FIG. 12 is a view illustrating a structure of a poly-phase filter including a low pass filter 1210.

FIG. 12 is a view illustrating an up-down conversion unit of a specific relay system. FIG. 12 includes a down conversion unit 1210 which frequency shifts an input signal of an IF band to a base band, and then, decreases a sampling rate through two decimators, and an up conversion unit 1240 which increases a sampling rate through two interpolators 1220, 1230 and frequency shifts a signal of the base band to the IF band.

The structure of FIG. 12 is completed based on the description of FIGS. 2, 3, 4, 5, and 11. In case the branch filters having an up poly-phase structure are converted into IIR filter, the low pass filter existing in interpolator #1 of the up converter unit of FIG. 12 can be used to eliminate a spectrum peak in a rejection band of whole poly-phase filter magnitude response which is generated as the phase response of each branch filter is not completely restored.

In the poly-phase filter including a low pass filter 1210 shown in FIG. 12, since a spectrum peak occurs in a constant frequency of a rejection band, a phase response of each branch filter can be completely restored.

Although embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims.

The invention claimed is:

1. A method for performing digital up-down conversion for a frequency conversion in a mobile communication system using plural frequency conversion, the method comprising:
   Infinite Impulse Response (IIR)-filtering an input signal by a magnitude response IIR filter having a filter coefficient calculated according to a Levinson polynomial, wherein the filter coefficient of the magnitude response IIR filter has a same magnitude response as in Finite Impulse Response (FIR) filtering and secures stability of the magnitude response IIR filter; and
   receiving, from the magnitude response IIR filter, the IIR filtered signal, and performing IIR filtering by a phase compensation IIR filter having a filter coefficient compensating for a non-linear phase to a linear phase,
   wherein IIR-filtering the input signal comprises:
   receiving a magnitude response of the input signal filtered by an FIR filter and calculating an impulse response signal using an Inverse Fast-Fourier Transform (IFFT);
   determining an order of the magnitude response IIR filter and calculating an autocorrelation sequence of the calculated impulse response signal;
   calculating a Levinson polynomial using the calculated autocorrelation sequence and checking security of stability according to the calculated Levinson polynomial; and
   determining the stable filter coefficient of the magnitude response IIR filter according to the Levinson polynomial when the security of stability is achieved.

2. The method of claim 1, further comprising increasing the order of the magnitude response IIR filter to compute the Levinson polynomial when the security of stability is not achieved.

3. The method of claim 2, wherein the stability is checked using parameters of a bounded-real function $p\rho+q(z)$, where
   p is an order of a denominator polynomial of the IIR filter and q is an order of a numerator polynomial of the IIR filter.

4. The method of claim 1, wherein receiving the IIR filtered signal comprises:
   receiving a reference phase providing a reference for phase compensation and the non-linear phase output from the magnitude response IIR filter;
   determining a convergence constant for setting a convergence speed and a convergence degree of an adaptive filter; and
   comparing the received non-linear phase with the received reference phase and compensating for the non-linear phase to the linear phase according to the convergence constant.

5. An apparatus for performing digital up-down conversion for a frequency conversion in a mobile communication system using plural frequency conversion, the apparatus comprising:
   a magnitude response unit for Infinite Impulse Response (IIR)-filtering an input signal by a magnitude response IIR filter having a filter coefficient calculated by a Levinson polynomial, wherein the filter coefficient of the magnitude response IIR filter has a same magnitude response as in Finite Impulse Response (FIR) filtering and secures stability of the magnitude response IIR filter; and
   a phase compensation unit for receiving the IIR filtered signal from the magnitude response IIR filter, and for performing IIR filtering by a phase compensation IIR filter having a filter coefficient compensating for a non-linear phase to a linear phase,
   wherein the magnitude response unit receives a magnitude response of the input signal filtered by the FIR filter to calculating an impulse response signal using an Inverse Fast-Fourier Transform (IFFT), determines an order of the magnitude response IIR filter and calculates an autocorrelation sequence of the calculated impulse response signal, calculates a Levinson polynomial using the calculated autocorrelation sequence and checks security of stability according to the computed Levinson polynomial, and determines the stable filter coefficient of the magnitude response IIR filter according to the Levinson polynomial when the security of stability is achieved.

6. The apparatus of claim 5, wherein the magnitude response unit increases the order of the magnitude response IIR filter to compute the Levinson polynomial when the security of stability is not achieved.

7. The apparatus of claim 6, wherein the stability is checked using parameters of a bounded-real function $p\rho+q(z)$, where
   p is an order of a denominator polynomial of the IIR filter and q is an order of a numerator polynomial of the IIR filter.

8. The apparatus of claim 5, wherein the phase compensation unit receives a reference phase providing a reference for phase compensation and the non-linear phase output from the magnitude response IIR filter, determines a convergence constant for setting a convergence speed and a convergence degree of an adaptive filter, compares the received non-linear phase with the received reference phase, and compensates for the non-linear phase to the linear phase according to the convergence constant.

* * * * *